United States Patent
Yu et al.

(10) Patent No.: US 7,629,273 B2
(45) Date of Patent: Dec. 8, 2009

(54) METHOD FOR MODULATING STRESSES OF A CONTACT ETCH STOP LAYER

(75) Inventors: Chen-Hua Yu, Hsin-Chu (TW); Hung Chun Tsai, Hsinchu (TW); Hui-Lin Chang, Hsin-Chu (TW); Ting-Yu Shen, JiJi Town (TW); Yung-Cheng Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 179 days.

(21) Appl. No.: 11/523,674

(22) Filed: Sep. 19, 2006

(65) Prior Publication Data

US 2008/0085607 A1 Apr. 10, 2008

(51) Int. Cl.
  *H01L 21/31* (2006.01)
  *H01L 21/469* (2006.01)
(52) U.S. Cl. ................ 438/792; 257/E21.241
(58) Field of Classification Search .......... 438/758, 438/771, 775, 778, 798; 257/E21.241
See application file for complete search history.

(56) References Cited

U.S. PATENT DOCUMENTS

| 6,310,367 | B1 | 10/2001 | Yagishita et al. | |
|---|---|---|---|---|
| 6,815,279 | B2 | 11/2004 | Yagishita et al. | |
| 6,939,814 | B2 | 9/2005 | Chan et al. | |
| 2005/0266639 | A1 | 12/2005 | Frohberg et al. | |
| 2006/0226519 | A1* | 10/2006 | Masonobu et al. | 257/649 |
| 2007/0082507 | A1* | 4/2007 | Iyer et al. | 438/795 |
| 2008/0017931 | A1* | 1/2008 | Shih et al. | 257/374 |
| 2008/0044967 | A1* | 2/2008 | Teh et al. | 438/199 |

* cited by examiner

*Primary Examiner*—W. David Coleman
(74) *Attorney, Agent, or Firm*—Slater & Matsil, L.L.P.

(57) ABSTRACT

A method for forming a semiconductor structure includes providing a substrate comprising a first device region, forming a metal-oxide-semiconductor (MOS) device in the first device region, forming a stressed layer over the MOS device, and performing a post-treatment to modulate a stress of the stressed layer. The post-treatment is selected from the group consisting essentially of ultra-violet (UV) curing, laser curing, e-Beam curing, and combinations thereof.

9 Claims, 6 Drawing Sheets

METHOD FOR MODULATING STRESSES OF A CONTACT ETCH STOP LAYER

TECHNICAL FIELD

This invention relates generally to metal-oxide-semiconductor (MOS) devices, and more particularly to MOS devices with stressed channel regions and processes for forming the same.

BACKGROUND

The scaling of VLSI circuits is a constant effort. With circuits becoming smaller and faster, improvement in device driving current is becoming more important. Device current is closely related to gate length, gate capacitance, and carrier mobility. Shortening poly-gate length, increasing gate capacitance, and increasing carrier mobility can improve the device current performance. Reducing gate length in order to shrink circuit size is an on-going effort. Increasing gate capacitance has also been achieved by efforts such as reducing the gate dielectric thickness, increasing the gate dielectric constant, and the like. In order to further improve device current, enhancing carrier mobility has also been explored. Among efforts made to enhance carrier mobility, forming a stressed silicon channel is a known practice. This technique allows the performance of MOS devices to be improved at a constant gate length without adding complexity to circuit fabrication or design.

It has been found that NMOS device performance is improved by tensile stresses in the channel region, while PMOS device performance is improved by compressive stress in the channel region. Stresses can be applied by forming a stressed capping layer, such as a contact etch stop layer (CESL), on an MOS device. FIG. 1 illustrates a conventional CESL scheme for a PMOS device 2 and an NMOS device 4. A compressive stressed CESL 6 is formed over PMOS device 2, while a tensile stressed CESL 8 is formed over NMOS device 4. For CESLs 6 and 8 to have different stresses, typically, two sets of CESL deposition, photolithography and etch processes have to be performed, each forming one of the CESLs 6 and 8. The cost for introducing different stresses is thus high. An additional problem is that conventional CESL films typically use silicon nitride, which has a high dielectric constant. As a result, the RC delay of the resulting integrated circuit is adversely affected.

The related art discloses another method for forming a CESL. The method includes forming a CESL layer having an inherent stress over an NMOS device and a PMOS device, and performing an ion implantation or plasma treatment on the CESL portion over the PMOS device, causing a change of the stress in the CESL portion over the PMOS device. CESL, however, may be formed of various materials, and not all materials respond desirably to plasma treatments. Thus, new methods for forming CESLs, in order to apply beneficial stresses to NMOS and PMOS devices, are needed.

SUMMARY OF THE INVENTION

The preferred embodiments of the present invention provide a semiconductor structure having different stresses in different device regions and a method to modulate stresses.

In accordance with one aspect of the present invention, the method includes providing a substrate, forming a stressed layer overlying the substrate, the stressed layer having a first-type stress, forming a patterned masking layer on the stressed layer, and performing an electromagnetic radiation treatment on the stressed layer, wherein the first-type stress of an unmasked portion of the stressed layer is convert to a second-type stress.

In accordance with one aspect of the present invention, the method includes providing a substrate comprising a first device region, forming a metal-oxide-semiconductor (MOS) device in the first device region, forming a stressed layer over the MOS device, and performing a post-treatment to modulate a stress of the stressed layer, wherein the post-treatment is selected from the group consisting essentially of ultra-violet (UV) curing, laser curing, e-Beam curing, and combinations thereof.

In accordance with another aspect of the present invention, the method includes providing a substrate having an active region, forming an MOS device in the active region, forming a contact etch stop layer overlying the MOS device, wherein the contact etch stop layer comprises a material selected from the group consisting essentially of carbon-doped silicon oxide, carbon-doped silicon nitride, silicon nitride, silicon oxynitride, and combinations thereof, and performing a curing process to the contact etch stop layer.

In accordance with yet another aspect of the present invention, the method includes providing a substrate having a first active region and a second active region, forming a first MOS device in the first active region, forming a second MOS device having an opposite conductivity type than the first MOS device in the second active region, forming a contact etch stop layer overlying the first and the second MOS devices, forming a mask layer to mask the first MOS device, and performing a curing process to modulate a stress of the contact etch stop layer over the second MOS device, wherein, after the curing process, the stress is of an opposite type than before the curing process, wherein the curing process is selected from the group consisting essentially of ultra-violet (UV) curing, laser curing, e-Beam curing, and combinations thereof.

By modulating the stresses, only one contact etch stop layer is formed. The contact etch stop layer has a tensile stress over an NMOS device and a compressive stress over a PMOS device.

DESCRIPTION OF THE DRAWINGS

For a more complete understanding of the present invention, and the advantages therof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for modulating stresses after the formation of a stressed layer is illustrated in FIGS. 2 through 7. Throughout the various views and illustrative embodiments of the present invention, like reference numbers are used to designate like elements.

Figure 1:
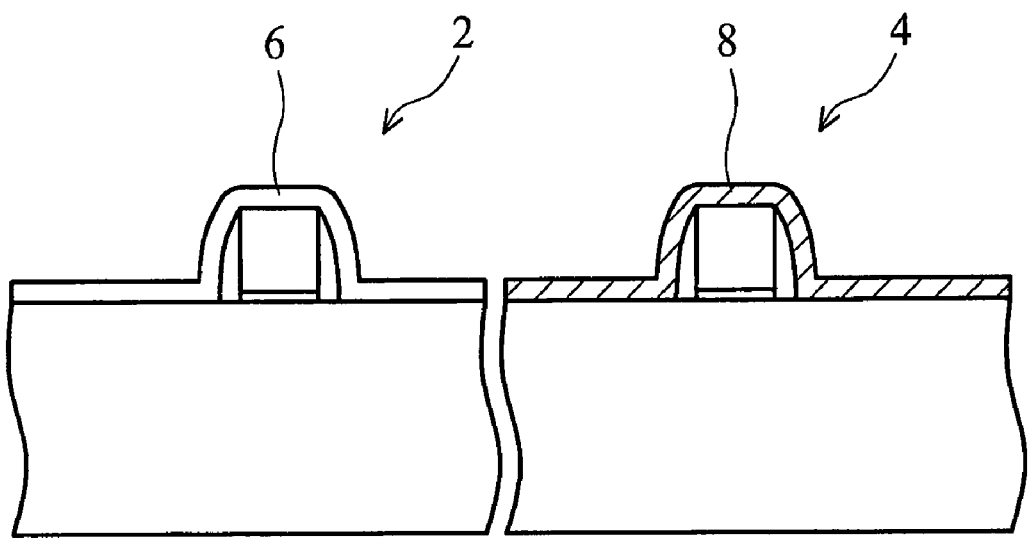
FIG. 1 illustrates a conventional semiconductor structure having a PMOS device and an NMOS device, wherein a compressive stressed contact etch stop layer is formed over the PMOS device, and a tensile stressed contact etch stop layer is formed over the NMOS device.
Figure 2:
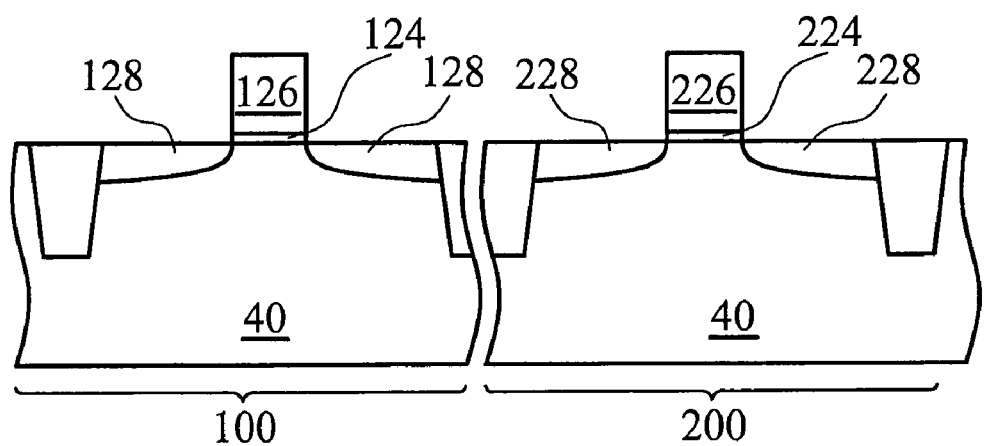
FIGS. 2 through 7 are cross-sectional views of intermediate stages in the manufacture of a preferred embodiment, wherein the stress in one portion of the contact etch stop layer is modulated to apply beneficial stresses to a PMOS device and an NMOS device.

Referring to FIG. 2, a substrate 40 is provided. Substrate 40 can be formed of common substrate materials such as silicon, SiGe, stressed silicon on SiGe, silicon on insulator (SOI), silicon germanium on insulator (SGOI), germanium on insulator (GOI), and the like. Substrate 40 preferably includes device regions 100 and 200, which are used for forming metal-oxide-semiconductor devices. In the following discussion, a PMOS device is formed in region 100, and thus region 100 is referred to as a PMOS device region. An NMOS device is formed in region 200, and thus region 200 is referred to as an NMOS device region.

A first gate structure including a gate dielectric 124 and a gate electrode 126 is formed in the first device region 100. A second gate structure including a gate dielectric 224 and a gate electrode 226 is formed in the second device region 200. As is well known in the art, in order to form the gate structures, a gate dielectric layer is formed on the substrate 40. The gate dielectric layer may be formed of silicon oxide or materials having high dielectric constants (k values), for example, with a k value of greater than 5. A gate electrode layer, preferably comprising polysilicon, metals, metal nitrides, metal silicides, and the like, is formed on the gate dielectric layer. The gate dielectric layer and the gate electrode layer are then patterned to form gate dielectrics 124 and 224 and gate electrodes 126 and 226 in regions 100 and 200, respectively.

Lightly doped drain/source (LDD) regions 128 and 228 are then formed in regions 100 and 200, respectively. To form LDD regions 128, a photoresist (not shown) is formed covering NMOS region 200. P-type impurities, such as boron and/or indium, are then implanted. Similarly, LDD regions 228 are formed by masking PMOS region 100 and implanting n-type impurities, such as phosphorous and/or arsenic.

Figure 3:
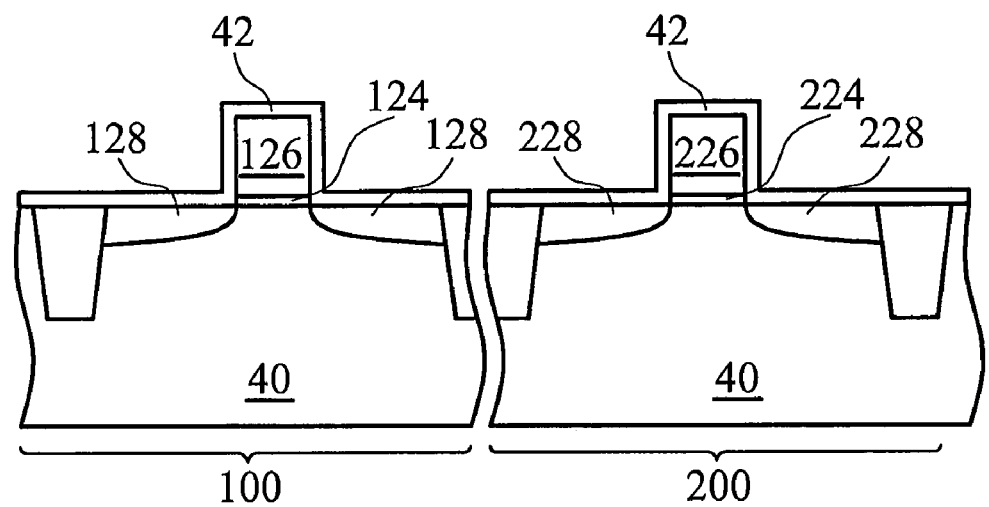

FIG. 3 illustrates a spacer layer 42 blanket deposited on the previously formed structure. In the preferred embodiment, spacer layer 42 includes a silicon nitride layer on a silicon oxide layer. In other embodiments, spacer layer 42 is formed of a material selected from nitrides, oxynitrides, oxides, and combinations thereof. In yet other embodiments, spacer layer 42 may have an oxide-nitride-oxide (ONO) structure, an ONN structure, and the like. The preferred formation methods include commonly used methods such as plasma enhanced chemical vapor deposition (PECVD), low pressure chemical vapor deposition (LPCVD), rapid thermal chemical vapor deposition (RTCVD), atomic layer deposition (ALD), physical vapor deposition (PVD), and the like.

Figure 4:
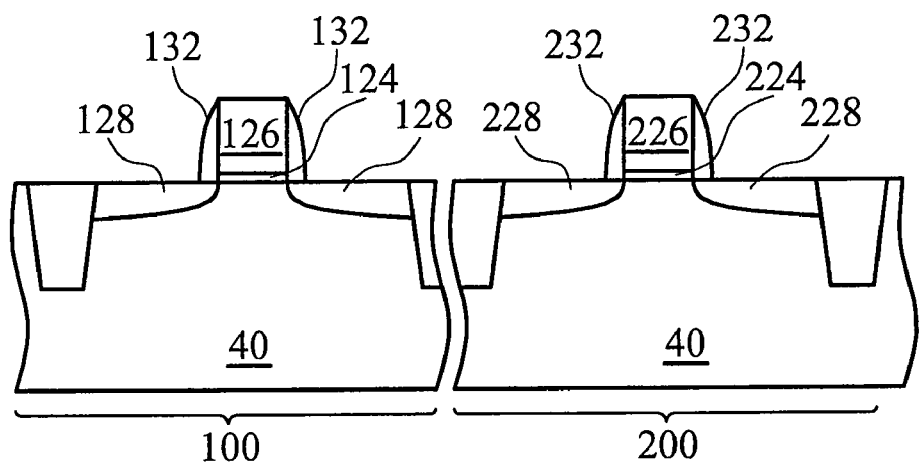

FIG. 4 illustrates the formation of the spacers 132 and 232 in regions 100 and 200, respectively, preferably by anisotropically etching, and more preferably by reactive ion etching (RIE), to remove spacer layer 42 from the horizontal surfaces.

Figure 5:
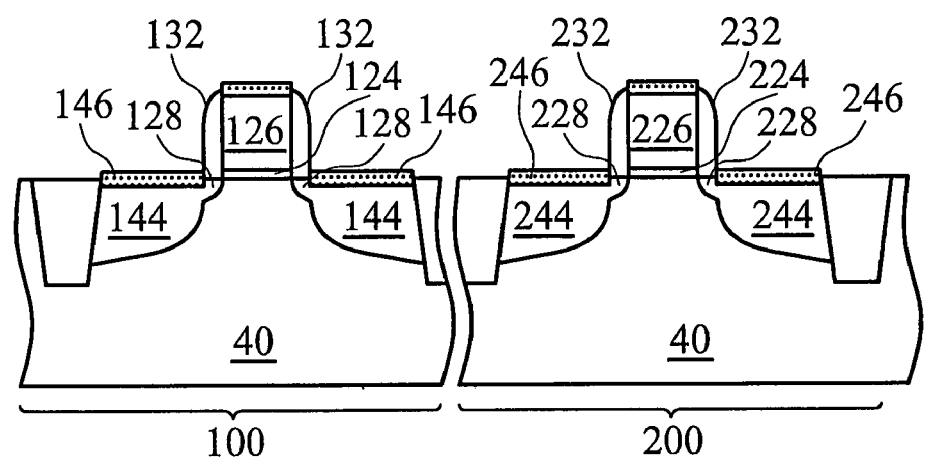

Referring to FIG. 5, source/drain regions 144 and 244 are formed in regions 100 and 200, respectively. Source/drain regions 144 and 244 may be recessed in or elevated above the substrate 40 (using, e.g., epitaxially grown regions), in which case the subsequently formed stress-inducing layer will also be recessed or elevated. In the preferred embodiment, source/drain regions 144 and 244 are formed by implanting appropriate impurities into semiconductor substrate 40. To form source/drain regions 144, a photoresist (not shown) is formed covering NMOS region 200. P-type impurities, such as boron and/or indium, are then implanted. Similarly, source/drain regions 244 are formed by masking PMOS region 100 and implanting n-type impurities, such as phosphorous and/or arsenic. Gate electrodes 126 and 226 are preferably simultaneously implanted with the source/drain regions to reduce sheet resistance.

Referring again to FIG. 5, silicide regions 146 and 246 are formed, preferably by a salicide process, on the respective source/drain regions 144 and 244. As is known in the art, in the salicide process for forming silicide regions, a metal layer is formed by first depositing a thin layer of metal, such as cobalt, nickel, titanium, and the like, over the device. The device is then annealed to form silicide regions between the deposited metal and the underlying exposed silicon regions. Un-reacted metal is then removed.

Figure 6:
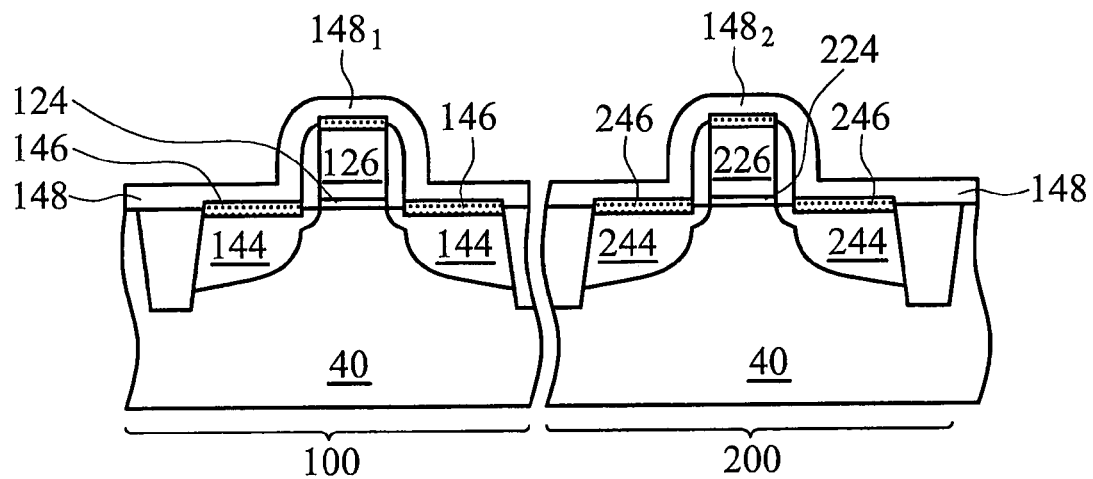

FIG. 6 illustrates a structure after the formation of a stressed layer 148, wherein a portion of the stressed layer 148 in PMOS region 100 is denoted as portion $148_1$, and the portion in NMOS region 200 is denoted as portion $148_2$. Although this layer is preferably a CESL and is interchangeably referred to as CESL 148 throughout the description, it can be any stressed layer or layers, even if the layer does not perform an etch stop function. The stressed layer 148 may also be a composite layer comprising a CESL and other layers. Preferably, the materials of CESL 148 include, but are not limited to, carbon-doped silicon oxide ($SiC_xO_y$), carbon-doped silicon nitride ($SiC_xN_y$), silicon nitride ($Si_xN_y$), silicon oxynitride ($SiO_xN_y$), and the like. It should be realized that different materials respond differently (with different stress change) to UV lights. It has been found that $SiC_xN_y$ is very sensitive to UV curing. Therefore, $SiC_xN_y$ is a good candidate for the present invention. CESL 148 is preferably formed by PECVD or other commonly used methods such as ALD and LPCVD. The preferred thickness is between about 50 Å and about 1500 Å.

In one exemplary embodiment, CESL 148 comprises $SiC_xN_y$, and the forming gases include carbon-containing precursors, preferably tetramethylsilane (4MS) or trimethyl-silane (3MS), as well as $NH_3$ and/or $N_2$. In other exemplary embodiments, CESL 148 comprises SiOC, and the forming gases also include carbon-containing precursors, preferably 3MS/4MS, and carbon dioxide ($CO_2$).

CESL 148 preferably has a high stress, for example, greater than about 300 MPa. As is known in the art, the stress of CESL 148 can be adjusted by choosing appropriate materials and methods of formation, and adjusting process conditions, such as temperature, deposition rate, power, etc. One skilled in the art can find the relationship between the stress in CESL 148 and the respective process conditions through routine experiments. In an exemplary embodiment wherein CESL 148 is formed of $SiC_xN_y$, the process conditions include a substrate temperature of 350° C., a chamber pressure of about 2.3 torr, and a power of about 1500W. The resulting CESL 148 has a compressive stress. If formed at a substrate temperature of 400° C., a chamber pressure of about 4.5 torr and a power of about 500 W, the resulting CESL 148 has a tensile stress. For discussion purposes, CESL 148 is assumed to have a compressive stress after its formation.

Figure 7:
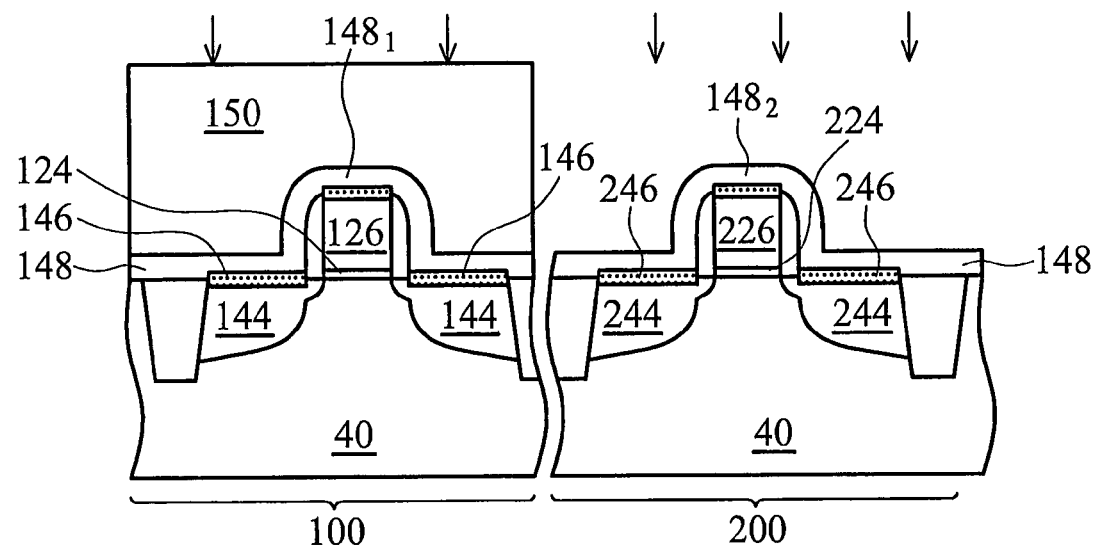

A mask layer 150 is formed to cover PMOS region 100, as is shown in FIG. 7. The function of mask layer 150 is to protect the underlying CESL layer 148 from the subsequent implantation and/or post-treatment processes. In the preferred embodiment, mask layer 150 is a reflective layer for reflecting the subsequently applied energy, and the preferred materials include, but are not limited to, anti-reflective coating, metal nitride such as titanium nitride (TiN), tantalum nitride (TaN), and the like. In other embodiments, mask layer 150 is an absorptive layer for absorbing the subsequently applied energy, and the preferred materials include, but are not limited to, amorphous carbon, amorphous silicon, photo resist, and the like. More preferably, mask layer 150 absorbs and reflects the subsequently energy, so that less energy penetrates and reaches the underlying CESL portion 148₁. Masking layer 150 may also comprise more than one layer, each performing one of the reflecting and absorbing functions.

An optional stress release step is then performed, as is symbolized by arrows. This step is preferably performed by implanting ions into exposed portions of CESL 148. In the preferred embodiment, germanium is implanted, which breaks Si—N bonds and releases the stress. As a result, the magnitude of the stress in CESL portion 148₂ is at least reduced, and can even be brought from a high stress to substantially zero stress. Alternatively, other relatively heavy ions such as arsenic, xenon, indium, antimony, and the like can be used. In yet other embodiments, silicon, nitrogen, oxygen and carbon may be implanted. Meanwhile, protected by mask layer 150, the stress in CESL portion 148₁ is substantially unchanged.

A post-treatment is then performed. Preferably, the post-treatment comprises ultra-violet (UV) curing. Alternatively, other curing methods such as laser curing, e-Beam curing, and the like can be used. Experiment results have shown that different process conditions may either cause a compressive stress to be turned into a tensile stress or a tensile stress to be turned into a compressive stress. In an exemplary embodiment wherein CESL layer 148 is formed of $SiC_xN_y$, the preferred UV curing conditions for converting a compressive stress to a tensile stress include a UV energy of between about 300 W/m² and about 2000 W/m², a substrate temperature of between about 50° C. and about 550° C., a treatment time of between about 2 minutes and about 120 minutes, and process gases including He, Ar and $H_2$. For CESLs formed of different materials, one skilled in the art will be able to determine appropriate process conditions for controlling the modulation of stresses.

The post-treatment modulates the stress of the exposed CESL portion 148₂, while CESL portion 148₁ is protected from the stress modulation by mask layer 150. In the embodiment wherein the MOS device in region 100 is a PMOS device and the MOS device in region 200 is an NMOS device, the stress modulation causes the stress in the CESL portion 148₂ to be changed to a tensile stress from a compressive stress. In the preferred embodiment wherein UV curing is performed, the preferred UV curing conditions include a wavelength of between about 200 nm and about 400 nm, a UV energy of between about 300 W/m² and about 2000 W/m², a substrate temperature of between about 250° C. and about 550° C., a treatment time of between about 2 minutes and about 120 minutes, and process gases including Ar, He, $H_2$.

In the previously discussed embodiment, CESL 148 has a compressive stress, and a portion 148₂ over an NMOS device is modulated to have a tensile stress. In alternative embodiments, CESL 148 has a tensile stress when deposited, and a portion 148₁ over a PMOS device is modulated to generate a compressive stress, wherein a portion 148₂ over an NMOS device is protected from the modulation by a mask layer (not shown). Again, before the step of post-treatment, a stress release step may be performed to portion 148₁ by implanting ions, such as germanium, arsenic, xenon, indium, antimony, silicon, nitrogen, oxygen, carbon and the like. The stress release step combined with the post-treatment has the ability of turning a tensile stress layer into a highly compressive stress layer. In an exemplary embodiment, CESL layer 148 comprises carbon-doped silicon nitride ($SiC_xN_y$), and the preferred UV curing conditions for converting a tensile stress to a compressive stress include a UV energy of between about 300 W/m² and about 2000 W/m², a substrate temperature of between about 50° C. and about 400° C., a treatment time of between about 2 minutes and about 120 minutes, and process gases including He, Ar and $H_2$.

In yet other embodiments, both CESL portions 148₁ and 148₂ are modulated in separate modulation processes using separate mask layers so that desired stresses are generated and/or enhanced. For example, in the embodiment where CESL portion 148₂ is modulated from compressive stress to tensile stress (refer to FIG. 7), an additional mask layer (not shown) is further formed to mask NMOS region 200, and a post-treatment is performed to increase the compressive stress in CESL portion 148₁.

It should be realized that the reflecting/absorbing properties of mask layer 150 is related to its material, thickness and the wavelength of the energy source (such as a UV source) of the post-treatment. Therefore, to achieve optimum effects, experiments are preferably performed to determine the optimum thickness of mask layer 150 based on the wavelength of the energy source and the material of mask layer 150. In an exemplary embodiment wherein the mask layer is formed of amorphous carbon and the energy source has a wavelength of about 200 nm, the thickness of mask layer 150 is preferably greater than about 100 nm.

Figure 8:
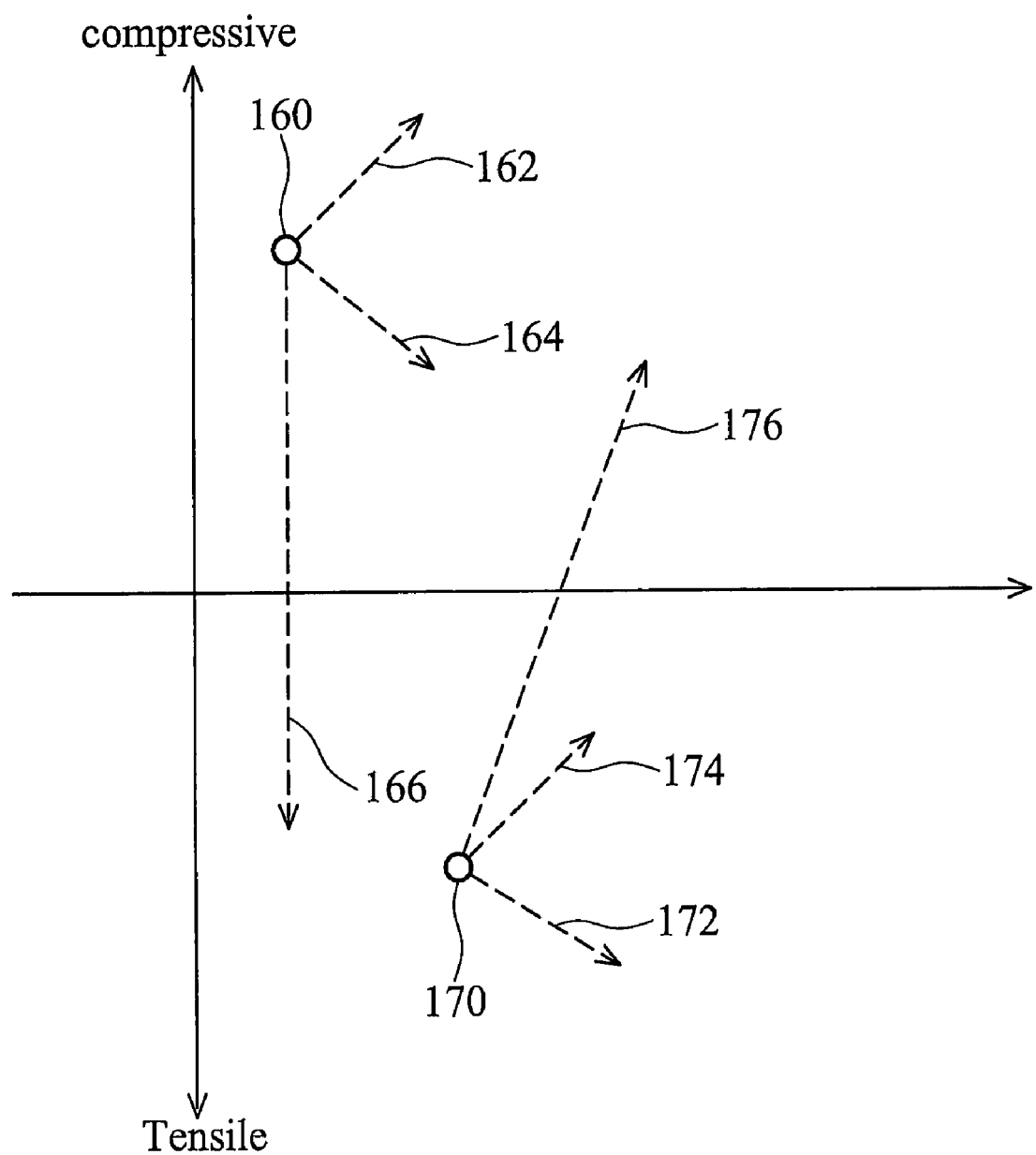
FIG. 8 schematically illustrates possible stress changes in a stressed layer due to the stress modulation.

FIG. 8 schematically illustrates the possible effect that may occur to a stressed layer after the post-treatment. A stressed layer has a compressive stress 160 before the stress modulation. After the stress modulation, the stressed layer may have a compressive stress with a greater magnitude (162) or a smaller magnitude (164), or may be turned into a tensile stress (166). A stressed layer originally having a tensile stress 170, on the other hand, may have a tensile stress with a greater magnitude (172) or a smaller magnitude (174), or may be turned into a compressive stress (176). The modulation of stresses toward desired directions may be achieved by adjusting process conditions such as energy, substrate temperature, treatment time, process gases, and chamber pressure, etc. Some process conditions for modulating a SiCN layer have been discussed in the preceding paragraphs. One skilled in the art will be able to find appropriate process conditions for modulating CESL layers formed of other materials through routine experiments.

Figure 9:
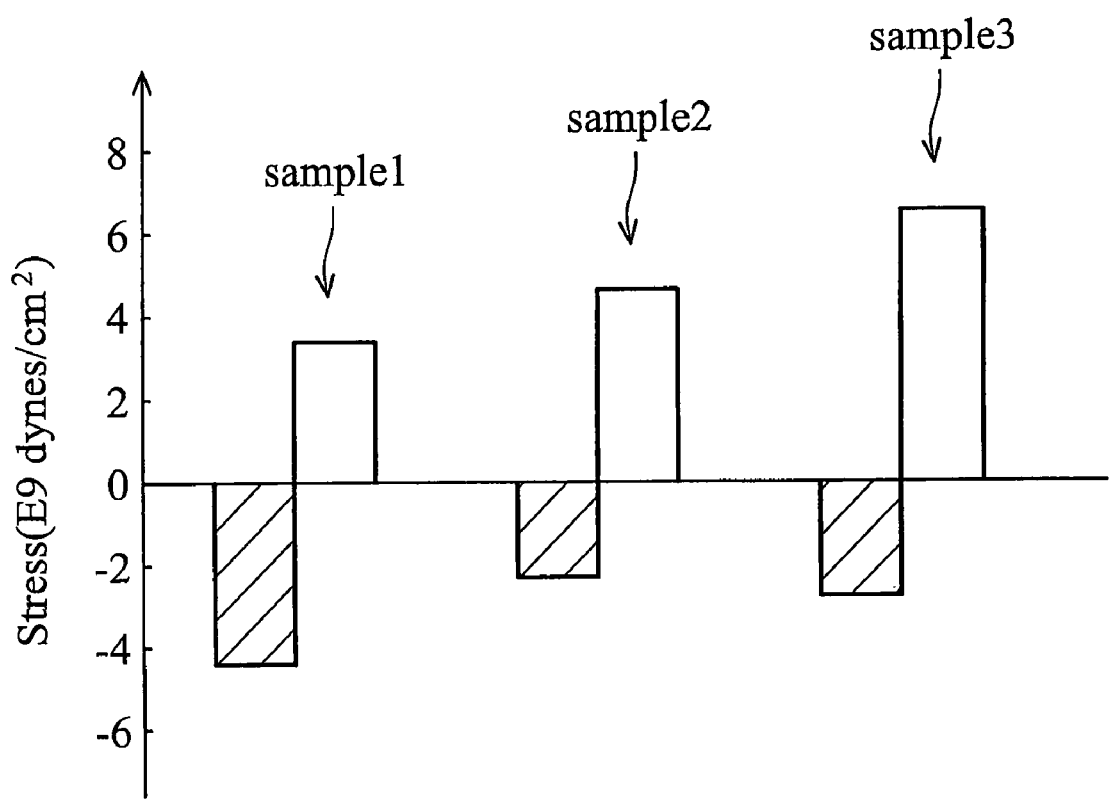
FIG. 9 illustrates experiment results of modulated contact etch stop layers.

FIG. 9 illustrates the experiment results of three samples with CESL layers, wherein the CESLs are formed of $SiC_xN_y$. Prior to the post-treatment, sample CESLs have compressive stresses (shaded bars) of between about 2E9 dynes/cm² and about 4E9 dynes/cm². After the post-treatment by UV curing, the stresses of the CESLs are turned to tensile stresses (unshaded bars) of about 3E9 dynes/cm² to over 7E9 dynes/cm².

The preferred embodiments of the present invention have several advantageous features. By modulating the stress, desired stresses may be achieved for PMOS and NMOS devices separately, although only one contact etch stop layer is formed. The process is thus simplified. In the preferred embodiment, $SiC_xO_y$, $SiO_xN_y$, $SiC_xN_y$, and/or $Si_xN_y$ may be used for the formation of the stressed layer. $SiC_xN_y$ is more sensitive to UV radiation than $Si_xN_y$. The k values of the $SiC_xO_y$, $SiO_xN_y$ and $SiC_xN_y$ based materials (typically ranging between about 3.0 and about 7.0) are lower than the k value of silicon nitride (typically 7.5 to 8). Accordingly, the parasitic capacitance, hence the RC delay, is lowered.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a substrate comprising a first device region;
   forming a first metal-oxide-semiconductor (MOS) device in the first device region;
   forming a stressed layer over the first MOS device;
   implanting the stressed layer; and
   performing a post-treatment to modulate a stress of the stressed layer, wherein the post-treatment is selected from the group consisting essentially of ultra-violet (UV) curing, laser curing, e-Beam curing and combinations thereof.

2. The method of claim 1, wherein the stress of the stressed layer is modulated from one of compressive type or tensile type to an opposite type.

3. The method of claim 1, wherein the stress of the stressed layer is increased in magnitude after the step of performing the post-treatment.

4. The method of claim 1, wherein the substrate further comprises:
   a second device region; and
   an additional MOS device having an opposite type from the first MOS device, wherein the stressed layer is over the additional MOS device, and wherein the stressed layer in the second device region is masked by a mask layer during the step of performing the post-treatment.

5. The method of claim 4 further comprising:
   masking the first device region; and
   performing an additional post-treatment to the stressed layer in the second device region, wherein process conditions for the post-treatment are substantially different from the process conditions of the additional post-treatment.

6. The method of claim 1, wherein the stressed layer comprises a material selected from the group consisting essentially of carbon-doped silicon oxide, carbon-doped silicon nitride, silicon nitride, silicon oxynitride and combinations thereof.

7. A method for forming a semiconductor structure, the method comprising:
   providing a substrate having a first active region and a second active region;
   forming a first MOS device in the first active region;
   forming a second MOS device having an opposite conductivity type than the first MOS device in the second active region;
   forming a contact etch stop layer overlying the first and the second MOS devices;
   forming a mask layer to mask the first MOS device;
   performing an implantation in the contact etch stop layer; and
   performing a curing process to modulate a stress of the contact etch stop layer over the second MOS device, wherein, after the curing process, the stress is of an opposite type than before the curing process, and wherein the curing process is selected from the group consisting essentially of ultra-violet (UV) curing, laser curing, e-Beam curing, and combinations thereof.

8. The method of claim 7, wherein the first MOS device is a PMOS device and the second MOS device is an NMOS device.

9. The method of claim 7 further comprising:
   removing the mask layer;
   forming an additional mask layer to mask the second MOS device; and
   performing an additional curing process, wherein process conditions of the curing process and the additional curing process are substantially different.

* * * * *